(12) United States Patent
Kabeshita et al.

(10) Patent No.: US 7,637,714 B2
(45) Date of Patent: Dec. 29, 2009

(54) APPARATUS AND METHOD FOR REMOVING SEMICONDUCTOR CHIP

(75) Inventors: Akira Kabeshita, Hirakata (JP); Kurayasu Hamasaki, Neyagawa (JP); Shozo Minamitani, Ibaraki (JP); Yoichi Makino, Kurume (JP); Noriyuki Tani, Kurume (JP)

(73) Assignee: Panasonic Corporation, Osaka (JP)

( * ) Notice: Subject to any disclaimer, the term of this patent is extended or adjusted under 35 U.S.C. 154(b) by 642 days.

(21) Appl. No.: 10/568,501

(22) PCT Filed: Sep. 7, 2004

(86) PCT No.: PCT/JP2004/013281

§ 371 (c)(1),
(2), (4) Date: Feb. 16, 2006

(87) PCT Pub. No.: WO2005/024932

PCT Pub. Date: Mar. 17, 2005

(65) Prior Publication Data

US 2006/0285965 A1 Dec. 21, 2006

(30) Foreign Application Priority Data

Sep. 8, 2003 (JP) ............................. 2003-315269

(51) Int. Cl.
*B29C 63/00* (2006.01)
(52) U.S. Cl. ..................... 414/806; 156/344
(58) Field of Classification Search ............ 414/222.05, 414/744.7, 752.1, 806; 156/344
See application file for complete search history.

(56) References Cited

U.S. PATENT DOCUMENTS

| 4,556,362 | A  | * | 12/1985 | Bahnck et al. ........... 414/744.3 |
| 4,778,326 | A  |   | 10/1988 | Althouse et al. |
| 4,921,564 | A  |   | 5/1990  | Moore |
| 5,839,187 | A  | * | 11/1998 | Sato et al. ..................... 29/743 |
| 5,950,613 | A  | * | 9/1999  | Wark et al. ..................... 125/35 |
| 6,464,444 | B1 | * | 10/2002 | Tsuji et al. .................. 414/411 |
| 6,709,543 | B2 | * | 3/2004  | Kurosawa .................... 156/344 |
| 6,751,853 | B2 | * | 6/2004  | Farnworth et al. ............ 29/743 |
| 7,060,593 | B2 | * | 6/2006  | Kurosawa et al. ........... 438/464 |
| 2001/0049160 | A1 | * | 12/2001 | Watanabe et al. ........... 438/113 |
| 2006/0090846 | A1 | * | 5/2006  | Cheung et al. .............. 156/344 |

FOREIGN PATENT DOCUMENTS

JP 5-218178 8/1993

(Continued)

*Primary Examiner*—Charles A Fox
(74) *Attorney, Agent, or Firm*—Wenderoth, Lind & Ponack, L.L.P.

(57) ABSTRACT

While a vicinity of a bottom surface-side region of a pressure-sensitive adhesive sheet, corresponding to an adhesion region of a semiconductor chip, is sucked and held, a plurality of protruding portions of a removing member are brought into contact with the bottom surface of the semiconductor chip through the adhesive sheet at the adhesion region. Also, the adhesive sheet is sucked in between the respective protruding portions so as to change an adhesive surface bond of the semiconductor chip to the adhesive sheet to point bonding. Further, the removing member is moved along the bottom surface of the semiconductor chip so as to change the position of the point bonding and decrease the adhesive bonding force to the adhesive sheet. Then, the semiconductor chip is removed from the adhesive sheet.

7 Claims, 7 Drawing Sheets

FOREIGN PATENT DOCUMENTS

| | | |
|---|---|---|
| JP | 5-335405 | 12/1993 |
| JP | 6-61347 | 3/1994 |
| JP | 11-274181 | 10/1999 |
| JP | 2000-195877 | 7/2000 |
| JP | 2002-111289 | 4/2002 |

* cited by examiner

APPARATUS AND METHOD FOR REMOVING SEMICONDUCTOR CHIP

BACKGROUND OF THE INVENTION

1. Technical Field

The present invention relates to an apparatus and a method for removing semiconductor chips and an apparatus for feeding semiconductor chips, in which one out of a plurality of semiconductor chips formed from a diced semiconductor wafer is removed from a pressure-sensitive adhesive sheet that holds the semiconductor chips by adhering thereto, and the semiconductor chip is ready to be extracted (picked-up) from the pressure-sensitive adhesive sheet.

2. Description of the Related Art

Conventionally, a plurality of semiconductor chips (hereinbelow referred to as IC chips) formed from a semiconductor wafer (hereinbelow referred to as a wafer) being diced are stored and transferred in the state of adhering to a wafer sheet (or a wafer tape) exemplifying the pressure-sensitive adhesive sheet. In order to enable one IC chip out of a plurality of IC chips in such a state of adhering to a wafer sheet to be ready to be taken out, the target IC chip is pushed up from the bottom surface of the wafer sheet, and the IC chip is removed from the wafer sheet.

However, IC chips are becoming smaller in a thickness and size, which causes a problem in that such thinner IC chips may suffer damage such as breakage of the IC chips during the push-up operation by the push-up pin.

In order to prevent the occurrence of such damage to the IC chips, for example, a method for performing the push-up operation while slowly raising the push-up pin has been considered, though such a method takes a long time and therefore is not practical.

Further, in an attempt to solve such a problem, there has conventionally been devised a method for preventing breakage of the IC chips by forming fine protruding and recess portions on a contact surface of a push-up apparatus, thereby reducing adhesion of the IC chips to the wafer sheet with the use of the protruding and recess portions. Then the IC chips are pushed up by a push-up pin so that the force necessary for the push-up operation is diminished (see, e.g., Japanese unexamined patent publication No. H11-274181, and Japanese unexamined patent publication No. 2000-195877). Such a method will be described below with reference to drawings FIGS. 8 and 9.

FIG. 8 is a schematic view showing an enlarged fragmental cross section of a contact portion of such a push-up apparatus with a wafer sheet. As shown in FIG. 8, the IC chips 112 adhere to the top surface of the wafer sheet 111 with a bond 113. Such respective IC chips 112 are, for example, removed from the wafer sheet 111, and taken out in the state of being sucked and held by a mounting head so as to be mounted on a circuit board. Moreover, as shown in FIG. 8, inside a cylinder-shaped pepper pot 121, which has a cylindrical casing like a pepper pot in the push-up apparatus, an elevating member 122 is housed in such a manner that allows up and down movement. Further, a push-up pin 123 for pushing up the IC chip 112 is provided on the top surface of the elevating member 122, and a cover plate 124 is provided on the top surface of the pepper pot 121. It is to be noted that reference numeral 119 denotes an outer cylinder serving as a stopper for attaching the cover plate 124 on the pepper pot 121 in a detachable manner.

Further, as shown in FIG. 8, a number of edged protruding and recess portions are formed on the top surface of the cover plate 124, and a number of hole portions 125 are formed in the respective recess portions. Among the recess portions, the hole portion 125 in the middle is a pin hole for allowing the push-up pin 123 to protrude from the inside of the pepper pot 121 (shown in phantom in FIG. 9), and the hole portions 125 around the middle hole portion are vacuum holes for vacuum-holding the wafer sheet 111.

The procedure for performing sucking and extracting operation through push-up of the IC chips 112 in the push-up apparatus having such a structure will now be described. First, as shown in FIG. 8, the pepper pot 121 is raised to press the cover plate 124 to the bottom surface of the wafer sheet 111. At the same time, the inside of the pepper pot 121 is vacuum-sucked by a vacuum suction means (not shown) so that the wafer sheet 111 is sucked and held onto the top surface of the cover plate 124 through the hole portions 125. Moreover, since the respective hole portions 125 are formed in the recess portions, the wafer sheet 111 is sucked to the surface of the recess portions, by which, as shown in FIG. 9, the wafer sheet 111 is forcedly removed from the bottom surface of the IC chip 112, and the IC chip 112 now only partially adhering to the top surface of the protruding portions. In this state, the push-up pin 123 is raised and protruded out of the hole portion 125 to push up the IC chip 112 while a suction nozzle 116 of a mounting head 115 vacuum-holds the IC chip 112 so that the IC chip 112 can be extracted.

In the sucking and extracting operation, the IC chip 112 is partially removed from the wafer sheet 111 by vacuum suction force of the hole portions 125, and in this partially removed state, the IC chip 112 is pushed up by the push-up pin 123. Consequently, the adhesion of the IC chip 112 by the bond 113 is weakened and so the force that is necessary to push up the IC chip 112 is decreased, which makes it possible to prevent the IC chip 112 from being damaged by the push-up operation.

SUMMARY OF THE INVENTION

However, with the development of the thinner IC chips, even if the adhesion of the IC chips to the wafer sheets is decreased by the partial removal, the problem that the IC chips may be damaged by push-up operation still exists as long as the push-up operation by the push-up pin is performed. For example, compared to the widely-used conventional IC chips having a thickness of approx. 150 to 200 μm, the thinner IC chips having a thickness of approximately 50 μm are susceptible to being damaged.

Further, as shown in the removing method disclosed in the aforementioned Japanese unexamined patent publication No. 2000-195877, there is a method in which the push-up operation by the push-up pin is omitted and the IC chips are removed only by the bottom surface of the wafer sheet 111 being sucked and held onto the top surface of the cover plate 124. In this removal method, the IC chips are sucked and extracted by a suction nozzle in the state of being partially removed from the wafer sheets. Consequently, in this sucking and extracting operation, the force required to remove the IC chips from the wafer sheets is applied to the IC chips themselves, and the thinner IC chips in particular have a problem in that the force inflicts damage thereon or if the force does not go so far as inflicting damage, then the removal operation may not be performed thoroughly.

Accordingly, in order to solve the above-described problems, an object of the present invention is to provide an apparatus and method for removing semiconductor chips and an apparatus for feeding semiconductor chips without damaging the thinner semiconductor chips in particular, in which one out of a plurality of semiconductor chips formed from a diced semiconductor wafer is removed from a pressure-sensitive adhesive sheet that holds the semiconductor chips by adhesion, so that the semiconductor chip can be extracted from the adhesive sheet.

In accomplishing these and other aspects, according to a first aspect of the present invention, there is provided an apparatus for removing semiconductor chip in which one out of a plurality of semiconductor chips formed from a diced semiconductor wafer is removed from a pressure-sensitive adhesive sheet which holds the semiconductor chips by adhering thereto, so that the semiconductor chip can be extracted from the adhesive sheet. The apparatus comprises:

a removing member having a plurality of protruding portions for coming into contact with a bottom surface of the semiconductor chip through the adhesive sheet and a plurality of suction hole portions formed in recess portions in between the respective protruding portions for sucking the adhesive sheet so as to partially remove the adhesive sheet from the semiconductor chip at suction positions;

a holding portion for sucking and holding the adhesive sheet around the removing member; and a removing member moving device for moving the removing member along the bottom surface of the semiconductor chip so as to vary contact positions of the adhesive sheet with the respective protruding portions and the suction positions of the adhesive sheet through the respective suction hole portions, wherein in a state that a bottom surface of the adhesive sheet is sucked and held by the holding portion and the adhesive sheet is sucked through the respective suction hole portions so as to be partially removed, the respective contact positions are moved to the suction positions by moving the removing member by the removing member moving device, so that a region of the partial removal between the bottom surface of the semiconductor chip and the adhesive sheet is made to expand.

According to a second aspect of the present invention, there is provided an apparatus for removing semiconductor chip as defined in the first aspect, wherein the removing member is formed so that an adhesion region of the semiconductor chip to be removed to the adhesive sheet is disposed in a region of a top surface of the adhesive sheet corresponding to a movement region of the respective protruding portions of the removing member by the removing member moving device.

According to a third aspect of the present invention, there is provided an apparatus for removing semiconductor chip as defined in the second aspect, wherein the holding portion is formed so that a region of a top surface of the adhesive sheet corresponding to a suction region by the holding portion is disposed adjacent or close to the adhesion region of the semiconductor chip to be removed.

According to a fourth aspect of the present invention, there is provided an apparatus for removing semiconductor chip as defined in the first aspect, wherein the respective suction hole portions are formed on bottom sections of the respective recess portions, and the bottom surfaces of the adhesive sheet disposed in between respective contact positions by the respective protruding portions adjacent to each other are sucked through the respective suction hole portions so as to be brought into contact with or be close to top surfaces of the respective recess portions for the removal.

According to a fifth aspect of the present invention, there is provided an apparatus for removing semiconductor chip as defined in the first aspect, wherein the semiconductor chip is almost entirely removed from the adhesive sheet by changing an almost entire bonding of the semiconductor chip to the adhesive sheet by adhesion to a partial bonding by suction through the respective suction hole portions, and further moving the removing member by the removing member moving device so as to change positions of the partial bonding and decrease bonding force by the adhesion.

According to a sixth aspect of the present invention, there is provided an apparatus for removing semiconductor chips as defined in the first aspect, wherein force of the holding portion to suck and hold the pressure-sensitive adhesive sheet is set to be larger than force of the respective suction hole portions to suck the pressure-sensitive adhesive sheet.

According to a seventh aspect of the present invention, there is provided an apparatus for removing semiconductor chip as defined in the first aspect, wherein a movement range of the respective protruding portions in the removing member is set to be larger than at least a formation interval of the respective protruding portions.

According to an eighth aspect of the present invention, there is provided an apparatus for removing semiconductor chip as defined in the first aspect, wherein the movement of the removing member by the removing member moving device is a reciprocal movement of the removing member along the bottom surface of the semiconductor chip.

According to a ninth aspect of the present invention, there is provided an apparatus for removing semiconductor chip as defined in the first aspect, wherein the movement of the removing member by the removing member moving device is a rotating movement of the removing member around a direction almost perpendicular to the bottom surface of the semiconductor chip.

According to a tenth aspect of the present invention, there is provided an apparatus for removing semiconductor chip as defined in the eighth aspect, wherein the removing member moving device is operable to move the removing member reciprocationally so as to vibrate the removing member.

According to an eleventh aspect of the present invention, there is provided an apparatus for feeding semiconductor chips. The apparatus comprises:

the apparatus for removing semiconductor chip as defined in the first aspect;

a wafer holding unit for holding the semiconductor wafer in the state of adhering to the adhesive sheet; and a removing apparatus moving device for relatively moving the apparatus for removing semiconductor chip along a surface of the semiconductor wafer which is held by the wafer holding unit and aligning one out of the respective semiconductor chips and the removing member; wherein the semiconductor chips are removed from the adhesive sheet so that the semiconductor chips are fed.

According to a twelfth aspect of the present invention, there is provided a method for removing semiconductor chip in which one out of a plurality of semiconductor chips formed from a diced semiconductor wafer is removed from a pressure-sensitive adhesive sheet which holds the semiconductor chips by adhering thereto, so that the semiconductor chip is possible to be extracted from the adhesive sheet. The method comprises:

bringing a plurality of protruding portions of a removing member into contact with a bottom surface of the semiconductor chip through the adhesive sheet at a region on a bottom surface side of the adhesive sheet while sucking and holding a vicinity of the bottom surface-side region of the adhesive sheet corresponding to an adhesion region of the semiconductor chip;

sucking the adhesive sheet in between the respective protruding portions so as to partially remove the adhesive sheet in the adhesion region from the semiconductor chip at suction positions;

moving respective contact positions with the protruding portions to the suction positions on the bottom surface-side region of the adhesive sheet by moving the removing member along the bottom surface of the semiconductor chip, so that a region of the partial removal in the adhesion region is made to expand.

According to a thirteenth aspect of the present invention, there is provided a method for removing semiconductor chip as defined in the twelfth aspect, wherein force to suck and hold the vicinity of the bottom surface-region of the adhesive sheet corresponding to the adhesion region is set to be larger than force to suck the adhesive sheet in between the respective protruding portions.

According to a fourteenth aspect of the present invention, there is provided a method for removing semiconductor chip as defined in the twelfth aspect, wherein the movement of the removing member is a reciprocal movement of the removing member along the bottom surface of the semiconductor chip.

According to a fifteenth aspect of the present invention, there is provided a method for removing semiconductor chip as defined in the fourteenth aspect, wherein an amplitude in the reciprocal movement of the removing member is larger than a formation interval of the respective protruding portions.

According to a sixteenth aspect of the present invention, there is provided a method for removing semiconductor chip as defined in the twelfth aspect, wherein the movement of the removing member is a rotating movement of the removing member around a direction almost perpendicular to the bottom surface of the semiconductor chip.

According to the first aspect of the present invention, in the apparatus for removing semiconductor chips, the removing member which comes into contact with the bottom surface of the semiconductor chip to be removed through the pressure-sensitive adhesive sheet, having a plurality of protruding portions which come into contact with the bottom surface of the semiconductor chip through the adhesive sheet, and a plurality of suction hole portions which are formed in the recess portions in between the respective protruding portions and which are capable of sucking the adhesive sheet. This makes it possible to partially remove the adhesive sheet from the bottom surface of the semiconductor chip at respective suction positions of the adhesive sheet by sucking through the respective suction hole portions in such a way that the adhesive sheet is close to or brought into contact with the surface of the respective recess portions.

Further, in the state that such a partial removal is performed, the removing member is moved by the removing member moving device along the bottom surface of the semiconductor chip so as to vary the contact positions of the respective protruding portions with the semiconductor chips through the adhesive sheet and the suction positions of the adhesive sheet through the respective suction hole portions (i.e. to shift the contact positions and the suction positions each other). By this movement, a region of the partial removal between the bottom surface of the semiconductor chip and the adhesive sheet is made to expand so as to reach an almost completely removed state so that the bonding force by the adhesion is considerably reduced.

With the semiconductor chip in this state, even if the semiconductor chip is, for example, a thinner semiconductor chip with a thickness of 50 μm or less, a sucking and extracting operation by a suction nozzle can be easily performed without a push-up operation by a push-up pin as in the conventional removing apparatus. Moreover, since the semiconductor chip is completely removed from the adhesive sheet or the bonding force by the adhesion is considerably reduced, the semiconductor chip will not be damaged even if the sucking and extracting operation by the suction nozzle applies a force to lift the semiconductor chip from the surface of the adhesive sheet. Therefore, particularly a thinner semiconductor chip, whose rigidity is bound to be lowered due to its shape, can be removed from the adhesive sheet and be ready to be extracted without being damaged.

Further, since the apparatus for removing semiconductor chips further includes the holding portion for sucking and holding, for example, the bottom surface of the adhesive sheet in the vicinity of the removing member, the holding portion makes it possible to reliably hold and fix the adhesive sheet even if the removing member is moved for the removal of the semiconductor chip. Therefore, the movement of the removing member achieves reliable and efficient removal of the adhesive sheet from the bottom surface of the semiconductor chip. Further, it becomes possible to prevent the occurrence of an influence of the removing operation on the adhesive sheet in the vicinity of the semiconductor chip including an influence of removing other semiconductor chips disposed therearound.

Further, according to another aspect of the present invention, it is structured such that the adhesion region of one semiconductor chip to be removed is disposed in a top surface region of the adhesive sheet corresponding to the movement region which is a movement range of the removing member by the removing member moving device, and that adhesion regions of other adjacent semiconductor chips are not disposed therein. Consequently, the moving operation of the removing member for the removal of the semiconductor chip makes it possible to reliably remove the adhesive sheet only from the one semiconductor chip to be removed without removing the adhesive sheet from the adjacent semiconductor chips.

Further, a top surface-region of the pressure-sensitive adhesive sheet corresponding to a suction region of the adhesive sheet by the holding portion is disposed adjacent or close to the adhesion region of the semiconductor chip to be removed, which makes it possible to reliably suck and hold the adhesive sheet during moving operation for the removal of the semiconductor chip, and prevent an influence of the moving operation from being exerted on the adjacent semiconductor chips and the like.

Further, the semiconductor chip is almost entirely removed from the adhesive sheet by changing an almost entire bonding of the semiconductor chip to the adhesive sheet by adhesion to a partial bonding through suction by the respective suction hole portions, and further moving the removing member so as to change respective positions of the partial bonding and considerably decrease bonding force by the adhesion. Thus, gradually decreasing the bonding force by the adhesion allows the removal of the semiconductor chip without the necessity of applying large force to the semiconductor chip by the removing operation, and makes it possible to prevent damage of the semiconductor chip and the like from occurring.

Further, force of the holding portion to suck and hold the adhesive sheet is set to be larger than force of the respective suction hole portions to suck the adhesive sheet, which makes it possible to reliably hold the adhesive sheet against force generated by movement of the removing member, thereby ensuring the removing operation.

Further, a movement range of the respective protruding portions in the removing member is set to be larger than at least a formation interval of the respective protruding portions, which makes it possible to reliably vary the contact positions of the top sections of the respective protruding portions with the semiconductor chips and the suction positions by the respective suction hole portions, thereby allowing more reliable removing operation.

Further, the movement of the removing member is a reciprocal movement along a bottom surface of the semiconductor chip, which makes it possible to reliably vary the contact positions and the suction positions while the movement range of the respective protruding portions in the removing member is kept small.

Further, if the movement of the removing member is a rotating movement, the structure of the removing member moving device can be simplified. Moreover, it becomes possible to structure the respective protruding portions so as to move in a wide range while the movement range of the removing member itself is kept small.

Further, the reciprocal movement of the removing member is achieved by vibrating the removing member, which makes it possible to simplify the structure of the removing member moving device.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
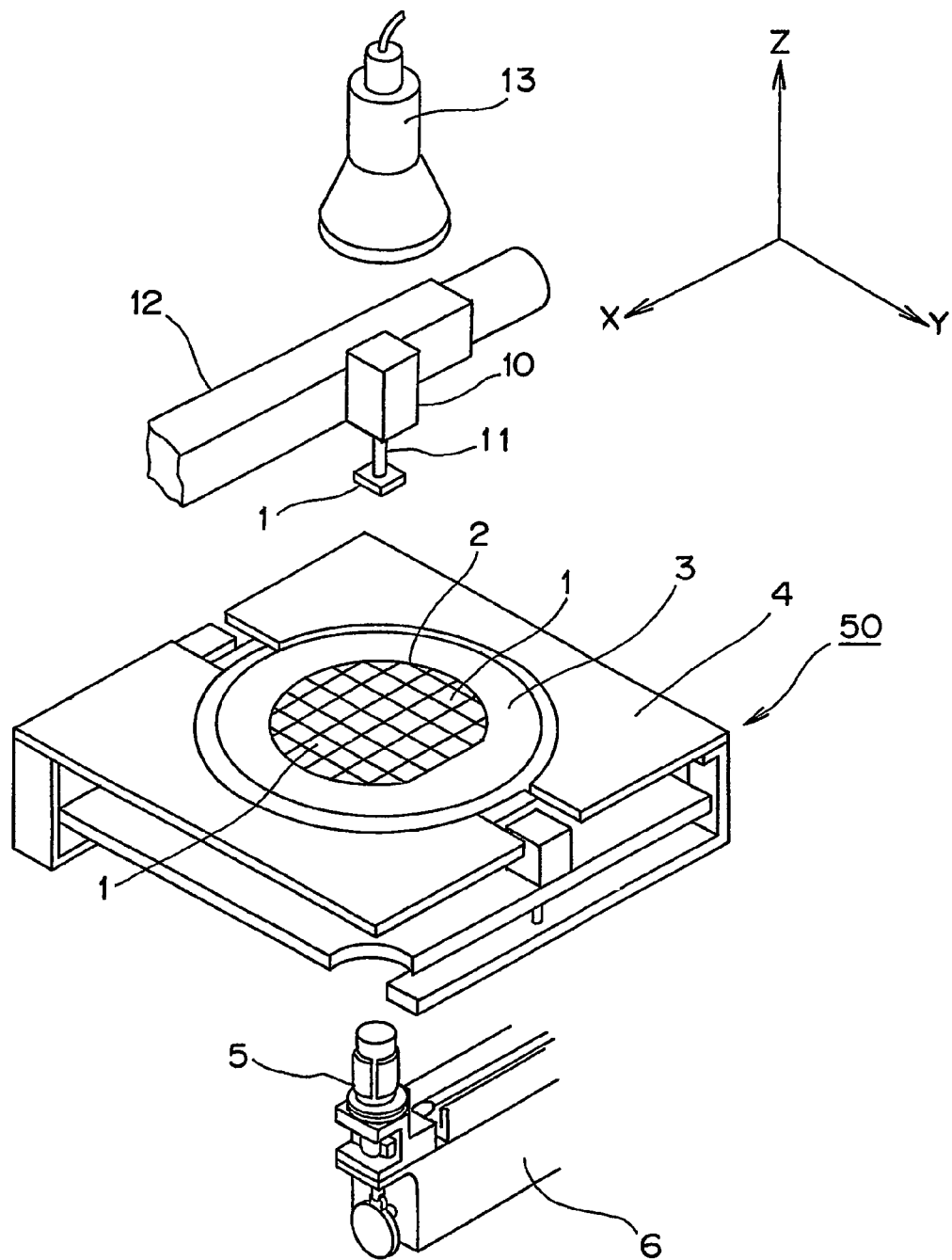
FIG. 1 is a schematic cross sectional view showing the structure of an apparatus for feeding IC chips in a first embodiment of the present invention.

Before the description of the present invention proceeds, it is to be noted that like parts are designated by like reference numerals throughout the accompanying drawings.

Hereinbelow, the embodiments of the present invention will be described in detail with reference to the accompanying drawings.

FIG. 1 is a schematic cross sectional view showing an apparatus for feeding IC chips 50 exemplifying a semiconductor chip feeding apparatus including an apparatus for removing semiconductor chip in one embodiment of the present invention.

As shown in FIG. 1, an apparatus for feeding IC chips 50 is an apparatus in which a plurality of IC chips 1, formed from a diced semiconductor wafer (hereinbelow referred to as a wafer) 2, is fed to, for example, a suction nozzle 11 included in a mounting head 10 in a component mounting apparatus so that the IC chips 1 are ready to be mounted on a circuit board. The IC chips 1 are IC chips which are thinner than general IC chips, which have a thickness of approximately 150 to 200 μm, and which have a thickness of, for example, approximately 50 μm or less.

Moreover, as shown in FIG. 1, the apparatus for feeding IC chips 50 comprises a wafer holding base 4 (exemplifying a wafer holding unit) for holding the diced wafer 2 in the state of adhering to a wafer sheet 3 that exemplifies a pressure-sensitive adhesive sheet, a removing apparatus 5 (exemplifying an apparatus for removing semiconductor chips) for removing the respective IC chips 1 from the wafer sheet 3 and making the IC chips 1 ready to be fed to the suction nozzle 11, and a removing apparatus moving device 6 for moving the removing apparatus 5 in the X-axis direction and the Y-axis direction in the drawing with respect to the wafer holding base 4 so as to align the removing apparatus 5 and one IC chip 1 out of the plurality of IC chips 1.

Further, the mounting head 10 is movable in the X-axis direction and the Y-axis direction in the drawing by an XY robot 12. Moreover, the suction nozzle 11 included in the mounting head 10 is capable of moving in Z-axis direction in the drawing, i.e., capable of moving up and down, and the IC chip 1 can be sucked and held by the suction nozzle. Further, above the apparatus for feeding IC chips 50, there is disposed a recognition camera 13 for recognizing the respective IC chips 1 disposed in the X-axis direction and the Y-axis direction on the wafer holding base 4.

Moreover, the wafer holding base 4 can perform a so-called expanding operation, which radially expands the wafer sheet 3 while holding the wafer sheet 3 so that the wafer 2 that is diced and adheres to the wafer sheet 3 is provided with spaces between the IC chips 1 that are adjacent to each other. By performing the expanding operation, one IC chip 1 can be sucked and extracted without the IC chips 1 adjacent to the one IC chip 1 being touched, thereby preventing the disposition of the adjacent IC chips 1 from being affected. It is to be noted that in FIG. 1, the X-axis direction and the Y-axis direction are directions along the surface of the wafer sheet 3 and perpendicular to each other, while the Z-axis direction is a direction perpendicular to the X-axis direction and Y-axis direction.

In such a structure, the apparatus for feeding IC chips 50 is capable of removing a desired IC chip 1 from the wafer sheet 3 with the removing apparatus 5, recognizing the disposition of the IC chip 1 with the recognition camera 13, moving the mounting head 10 with the XY robot 12 based on the recognition result, aligning the suction nozzle 11 with the IC chip 1, and moving the suction nozzle up and down for sucking and extracting the IC chip 1 (i.e., feeding the IC chip 1 from the apparatus for feeding IC chips 50).

Herein, a detailed structure of the removing apparatus 5 included in the apparatus for feeding IC chips 50 will be described with reference to the schematic cross sectional view of the removing apparatus 5 in FIG. 2.

Figure 2:
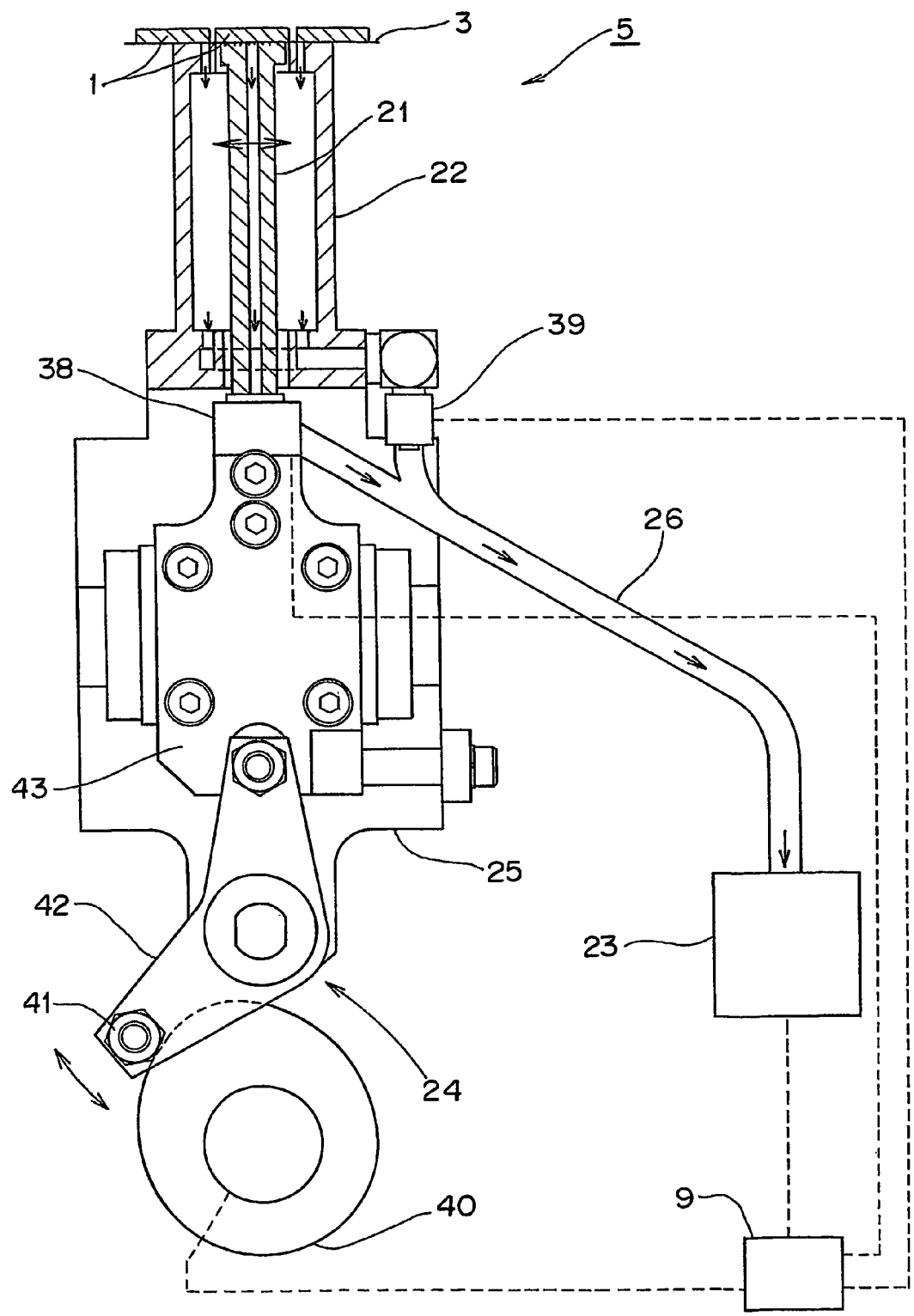
FIG. 2 is a schematic cross sectional view showing the structure of a removing apparatus included in the apparatus for feeding the IC chips of FIG. 1.

As shown in FIG. 2, the removing apparatus 5 comprises a removing portion 21 exemplifying a removing member for contacting the bottom surface of the wafer sheet 3 and performing an operation to remove the IC chip 1 in the state of adhering to the wafer sheet 3 while sucking the wafer sheet 3 with use of a vacuum, a pepper pot 22 exemplifying a holding portion which is in a cylinder shape so as to house the removing portion 21 therein and for sucking and holding the vicinity of the wafer sheet 3 that is in contact with the removing portion 21 with the use of a vacuum, a vacuum pump 23 for generating the respective vacuums, and a reciprocating moving apparatus 24 for moving the removing portion 21 along the surface of the wafer sheet 3, that is for example, moving reciprocally the removing portion 21 along the surface of the wafer sheet 3 with a constant amplitude. It is to be noted that the removing portion 21 is supported by the moving apparatus 24, and the moving apparatus 24 and the pepper pot 22 are fixed to a frame 25. Further, the vacuum pump 23, the removing portion 21 and the pepper pot 22 are linked to each other through a connecting pipeline 26 so that the vacuum produced in the vacuum pump 23 can be transmitted as indicated by the arrows in the removing portion 21, the pepper pot 22, and the connecting pipeline 26.

Figure 3:
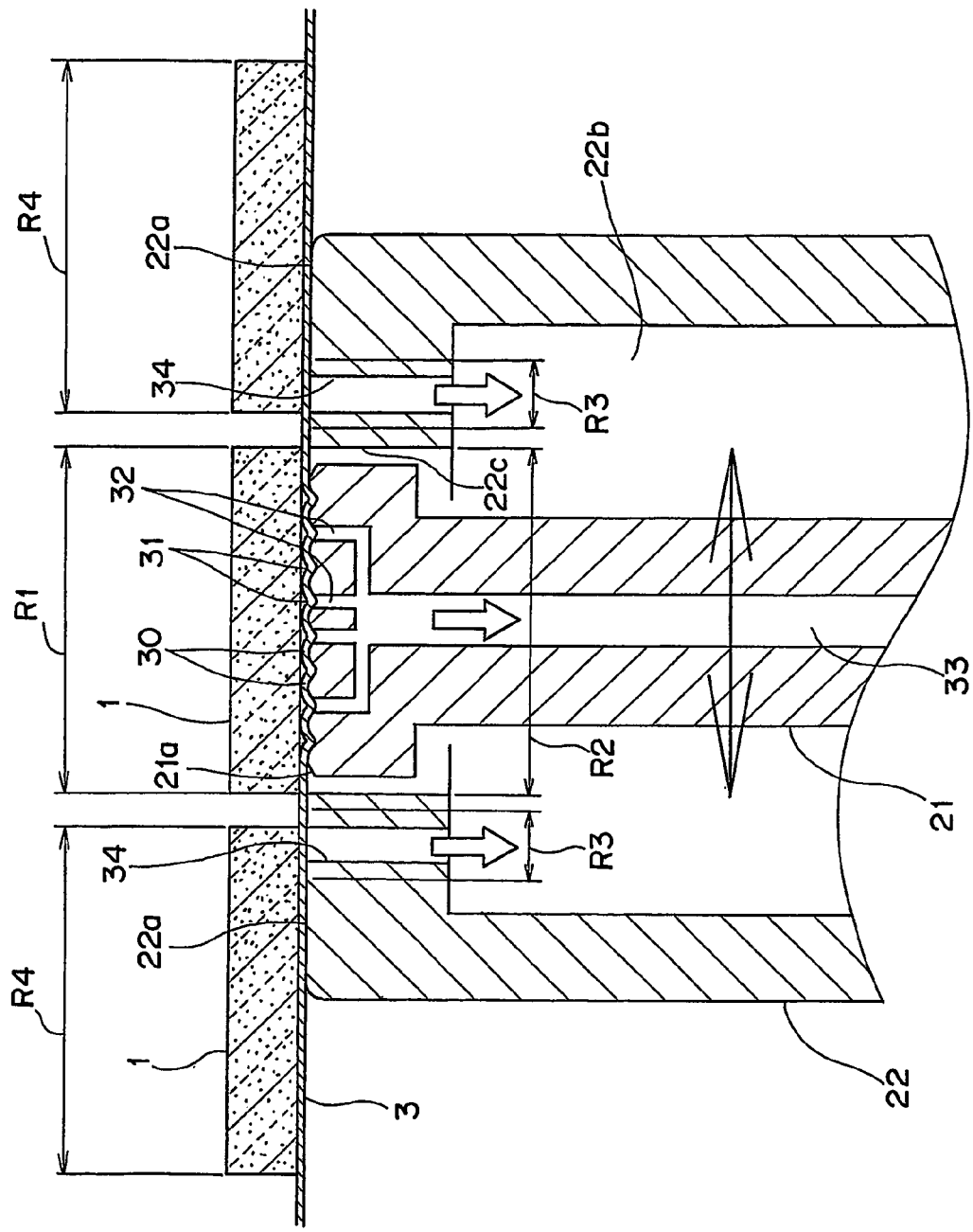
FIG. 3 is a fragmentary enlarged cross sectional view showing an upper part of the removing apparatus of FIG. 2.

Herein, FIG. 3 shows an enlarged schematic view of the upper part of the removing portion 21 and the pepper pot 22. As shown in FIG. 3, the removing portion 21 is positioned inside the pepper pot 22 so that a contact plane 21a of the removing portion 21 with the wafer sheet 3 and a contact plane 22a of the pepper pot 22 with the wafer sheet 3 are positioned at almost the same height. Also, a plurality of protruding portions 30 are formed on the contact plane 21a of the removing portion 21, and a plurality of suction hole portions 32 are formed on the bottom sections of recess portions 31 formed in between the respective protruding portions 30. Further, the respective suction hole portions 32 are linked to the connecting pipeline 26 outside the removing portion 21 through a connecting pipeline 33 formed inside the removing portion 21 and a valve 38 (shown in FIG. 2) disposed at some midpoint of the connecting pipeline 33. Thus, the respective suction hole portions 32 are connected to the vacuum pump 23 through the connecting pipelines 33 and 26, which makes it possible to apply a vacuum to the respective suction hole portions 32. Further, opening the valve 38 allows transmission of a vacuum while closing the valve 38 allows interception of the transmission of a vacuum. It is to be noted that the formation pitch of the respective protruding portions 30 depends on the size and the like of a target of removal, the IC chip 1. For example, in the case of an IC chip 1 with a size of 9 mm wide×11 mm long×50 μm thick, the formation pitch is set at 1 to 1.5 mm.

Moreover, as shown in FIG. 3, unlike the contact plane 21a of the removing portion 21 which is formed into a dented state, the contact plane 22a of the pepper pot 22 is formed into an almost flat plane, and a plurality of suction hole portions 34 are formed on the plane. Also, the respective suction hole portions 34 are linked to an inside of the pot 22b that is a space inside the pepper pot 22, and the inside of the pot 22b is linked to the connecting pipeline 26 outside the pepper pot 22 through a valve 39 (shown in FIG. 2). Thus, the respective suction hole portions 34 are connected to the vacuum pump 23 through the inside of the pot 22b and the connecting pipeline 26, which makes it possible to apply a vacuum to the respective suction hole portions 34. Further, opening the valve 39 allows transmission of the vacuum while closing the valve 39 allows interception of the transmission of the vacuum.

Further, as shown in FIG. 2, the reciprocating moving apparatus 24 comprises a cam portion 40 which is disposed in the direction along the surface of the wafer sheet 3 and which has a deflected center of rotation, an L-shape member 42 having a cam follower portion 41 which is constantly in contact with the periphery of the cam portion 40 on its one end, and a reciprocating moving block 43 which is supported by the inside of the frame 25 in a manner that allows reciprocating movement in horizontal direction in the drawing, that is the direction along the surface of the wafer sheet 3. The moving block 43 is fixed to the other end of the L-shape member 42 and supports the removing portion 21. Moreover, though not shown in FIG. 2, the reciprocating moving apparatus 24 has a rotary driving device which imparts a rotary motion to the cam portion 40 around the center of rotation. Moreover, the L-shape member 42 has a center of rotation which is disposed in the same direction as the center of rotation of the cam portion 40, and is fixed to the frame 25 in a rotatable manner around the center of rotation.

In the thus-structured reciprocational moving apparatus 24, by driving the rotary driving device (not shown) to impart the rotary motion to the cam portion 40, the cam follower portion 41, which is in the state of being constantly in contact with the periphery of the cam portion 40, can be moved reciprocally at a specified amplitude in a radial direction of the cam portion 40. This is because the periphery of the cam portion 40 is formed as a deflected circle. Further, upon the reciprocal movement of the cam follower portion 41, the L-shape member 42 can be rotated such that the other end is vibrated at a specified amplitude with the center of rotation as a supporting point. This enables the reciprocating moving block 43 to move reciprocally inside the frame 25, and so the removing portion 21 fixed to the reciprocational moving block 43 can be given a reciprocal movement with a specified amplitude, e.g., a reciprocal movement such as vibration. It is to be noted that the amplitude of such reciprocal movement of the removing portion 21 should preferably be set to be almost equal to or more than the formation pitch of the respective protruding portions 30 formed on the contact plane 21a of the removing portion 21, that is approximately 1 to 1.5 mm for example. Moreover, even if such reciprocal movement is performed, the reciprocating moving block 43 is disposed so as not to be touched by the frame 25, and the removing portion 21 is movable without touching the inside of the pepper pot 22.

Figure 4:
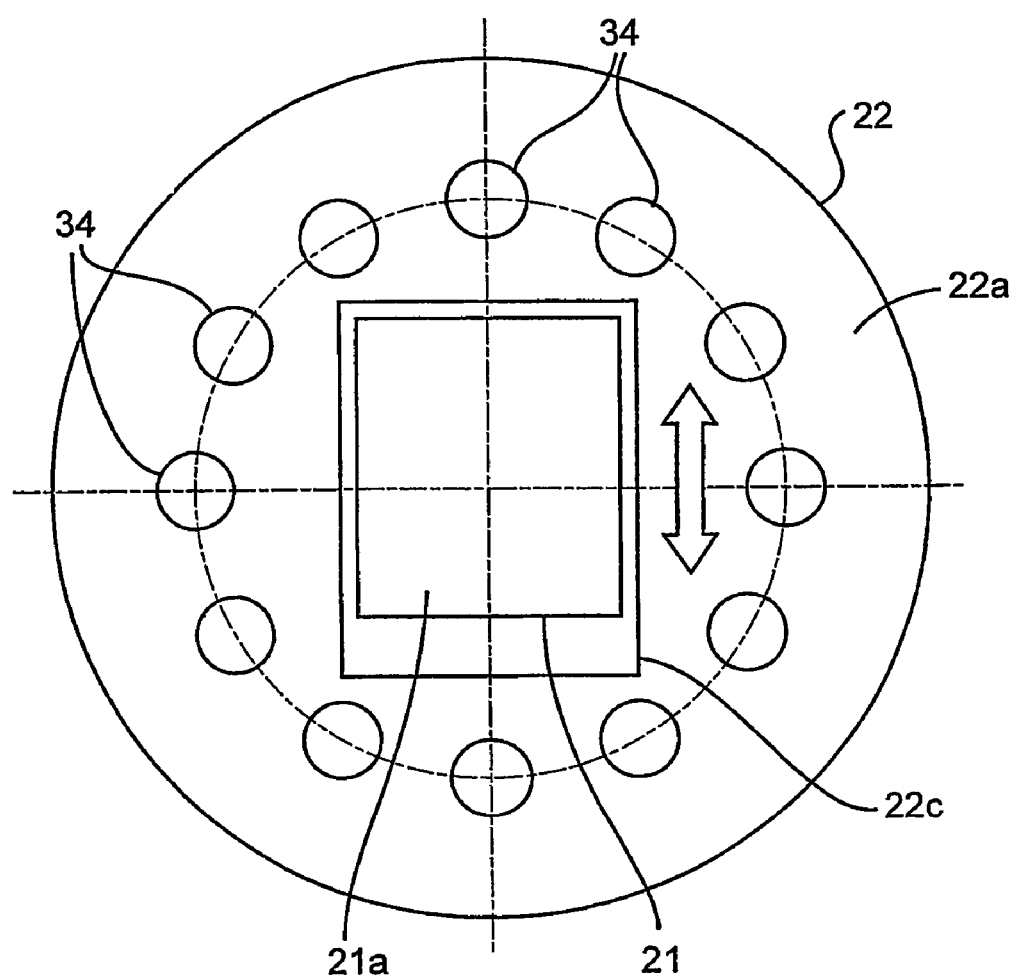
FIG. 4 is a schematic plan view showing the upper part of the removing apparatus of FIG. 2.

Herein, FIG. 4 shows a schematic plan view of the contact plane 21a of the removing portion 21 and the contact plane 22a of the pepper pot 22 in the removing apparatus 5 as viewed from above. As shown in FIG. 4, on the contact plane 22a of the almost circular-shaped pepper pot 22, a plurality of the suction hole portions 34 are disposed so as to align on the circumference at certain intervals. Moreover, inside the circular array of the suction hole portions 34, there is formed a removing portion movable opening 22c that is open in an almost rectangular shape. Further, the contact plane 21a of the removing portion 21 formed into an almost rectangular shape as well is disposed inside the removing portion movable opening 22c. It is to be noted that the contact plane 21a of the removing portion 21 is formed to be slightly smaller than the removing portion movable opening 22c, and therefore even by the reciprocal movement, the contact plane 21a will not come into contact with the removing portion movable opening 22c. Moreover, a formation region of the removing portion movable opening 22c can almost match with a movement range of the contact plane 21a.

The following description discusses the disposition relation between the disposition of the IC chip 1 to be removed and the disposition of the contact plane 21a of the removing portion 21 and the contact plane 22a of the pepper pot 22 with reference to FIG. 3. As shown in FIG. 3, the removing portion movable opening 22c is disposed so as to be equivalent to an adhesion region R1 of the IC chip 1 to be removed to the wafer sheet 3. In other words, the IC chip 1 adheres to a region above the wafer sheet 3 that is equivalent to a movement region R2 that is a movement range of the contact plane 21a of the removing portion 21. Moreover, a bottom surface-side region of the wafer sheet 3 that is equivalent (corresponding) to a region almost adjacent to or close to the adhesion region R1 of the IC chip 1 is a suction region R3 of the wafer sheet 3 sucked by each of the suction hole portions 34. It is to be noted that the region equivalent to each of the suction hole portions 34 and the vicinity thereof is the suction region R3. The adhesion region R1 of the IC chip 1, the movement region R2 of the contact plane 21a of the removing portion 21, and the suction region R3 of the respective suction hole portions 34 are disposed in this way, so that only the adhesion region R1 of the IC chip 1 to be removed is disposed on the top surface region of the wafer sheet 3 corresponding to the movement region R2, and an adhesion region R4 of adjacent IC chips 1 which should not be removed is not disposed in the pertinent region. Further, the suction region R3 is disposed around the movement region R2, which makes it possible to reliably hold the wafer sheet 3 so as to surround the movement region R2.

Further, as shown in FIG. 2, the removing apparatus 5 includes a control section 9 which comprehensively performs control over the reciprocating operation of the removing portion 21 by the reciprocating moving apparatus 24, control over driving and driving termination operation of the vacuum pump 23, and control over open/close operation of each of the valves 38, 39 while associating these operations to each other. Thus, the presence of the control section 9 makes it possible to control the timing of the suction operation by each of the suction hole portions 32, 34 and the timing of the reciprocational moving operation of the removing portion 21 while associating these timing operations with each other. Moreover, the control section 9 is structured, for example so as to be integrated or associated with a control section (not shown) included in the apparatus for feeding IC chips 50 makes it possible to perform control over the holding operation of the wafer sheet 3 by the wafer holding base 4, control over moving operation of the removing apparatus 5 by the removing apparatus moving device 6, and control over respective operations in the removing apparatus 5 while associating the respective control operations to each other.

The following description discusses the operation in the above-structured apparatus for feeding IC chips 50, in which one IC chip 1 adhering onto the wafer sheet 3 is removed by the removing apparatus 5 and is ready to be sucked and extracted by the suction nozzle 11. It is to be noted that the respective operations described later are comprehensively controlled by the control section included in the apparatus for feeding IC chips 50 or the control section 9 included in the removing apparatus 5 while being associated with each other.

First, as shown in FIG. 1, on the wafer sheet 3 to which the wafer 2 adheres in the state of being expanded, one IC chip 1 which should be removed (should be sucked and extracted) and the removing apparatus 5 are aligned by the removing apparatus moving device 6. It is to be noted that the movement of the removing apparatus 5 is conducted in the state in which the respective contact planes 21a and 22b, which are the upper part of the removing apparatus 5, are constantly in contact with the bottom surface of the wafer sheet 3. Moreover, during the moving operation, the respective valves 38, 39 are in a closed state and therefore the wafer sheet 3 is not sucked by the respective suction hole portions 32, 34. It is to be understood that the case where the respective contact planes 21a, 22a are constantly in contact with the bottom surface of the wafer sheet 3 may be replaced with the case where movement of the removing apparatus 5 is conducted without the contact. In such a case, it is necessary to provide a device for raising the removing apparatus 5 or for lowering the wafer holding base 4 in order to bring the respective contact planes 21a, 22a into contact with the bottom surface of the wafer sheet 3 after the movement of the removing apparatus 5.

Once the aligning operation is performed, the adhesion region R1 of the one IC chip 1 and the movement region R2 of the removing portion 21 are in the state of being almost matched as shown in FIG. 3. After that, the vacuum pump 23 is activated (or it may be activated in advance), and the respective valves 38, 39 are put in an open state. Consequently, as shown by the arrows in FIG. 2, a vacuum generated in the vacuum pump 23 is transmitted to the respective suction hole portions 32 through the connecting pipeline 26, the valve 38 and the connecting pipeline 33, and also transmitted to the respective suction hole portions 34 through the connecting pipeline 26, the valve 39 and the inside of the pot 22b. As a result, on the contact plane 21a of the removing portion 21, while the respective protruding portions 30 are in contact with the bottom surface of the IC chip 1 through the wafer sheet 3, the wafer sheet 3 is put in the state of being sucked so as to be in contact with or close to the surface of the respective recess portions 31 through suction of the wafer sheet 3 by the respective suction hole portions 32. More specifically, in the movement region R2 and the adhesion region R1, the wafer sheet 3 is put in the state where a waveform shape is maintained so as to be in close contact with the recess and protruding portions of the contact plane 21a of the removing portion 21.

Figure 5:
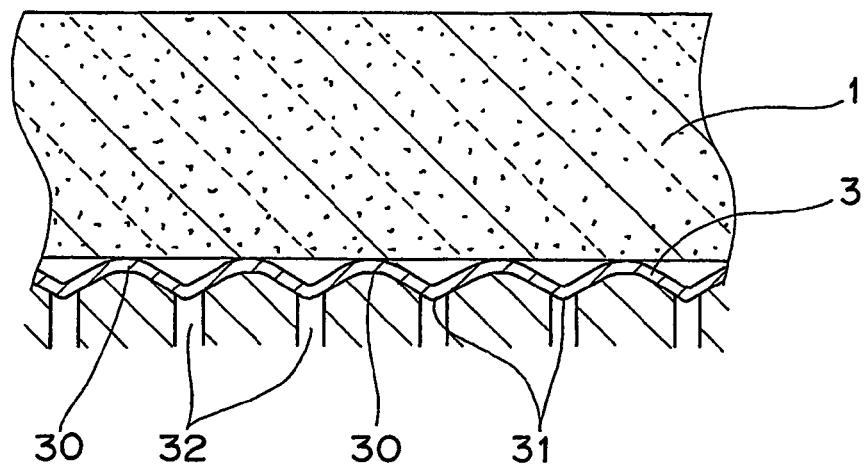
FIG. 5 is a schematic explanatory view showing the removing operation in the sucking and holding state of a wafer sheet by a contact plane of a removing portion.

This state is the state shown in FIG. 5. In the adhesion region R1, the IC chip 1 in the state of being almost entirely bonded to the wafer sheet 3 (e.g., the surface bonded state) is partially removed from the wafer sheet 3 in sections corresponding to the respective recess portions 31, and is put in a state of being partially bonded in sections corresponding to the top sections of the respective protruding portions 30, e.g., the point bonded state.

Unlike the almost entire bonding in which almost entire bottom surface of the IC chip 1 adheres to the wafer sheet 3, the partial bonding herein refers to a local bonding in which the IC chip 1 is surface-bonded over an area that is sufficiently smaller than the area of the bottom surface of the IC chip 1. Such a sufficiently small area refers to an area which includes, as described above, the top sections of the respective protruding portions 30 and the vicinity thereof. Moreover, the surface-bonding (i.e., partial bonding) with such a sufficiently small area includes bonding at an elongated band-like plane. This is because the top sections of the respective protruding portions 30 may be formed into a line shape.

In the suction region R3 disposed around the movement region, the wafer sheet 3 is put in the state of being sucked and held by the transmitted vacuum.

Then, in the reciprocational moving apparatus 24, the rotary driving device (not shown) rotationally drives the cam portion 40, and the rotational motion of the cam portion 40 is transmitted through the cam follower portion 41, the L-shape member 42 and the reciprocational moving block 43 and converted to the reciprocal motion of the removing portion 21. By the reciprocal motion of the removing portion 21, the contact plane 21a is moved reciprocally in the state of sucking the wafer sheet 3. This state is shown in FIG. 6 (see the double-headed movement arrow).

Figure 6:
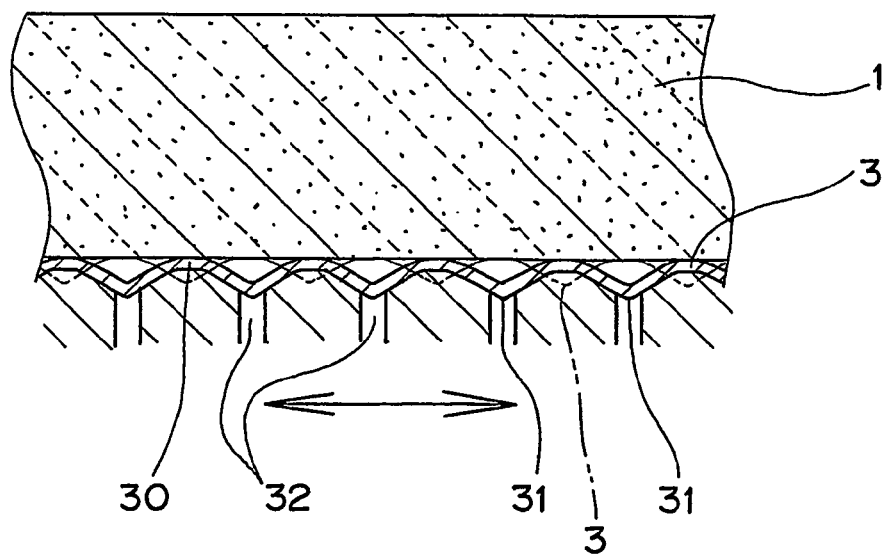
FIG. 6 is a schematic explanatory view showing the reciprocating removing operation in the state of the contact plane after the sucking and holding state by the contact plane in FIG. 5.

As shown in FIG. 6, moving the contact plane 21a reciprocationally along the bottom surface of the IC chip 1 at a specified amplitude allows the positions of the respective protruding portions 30 and the recess portions 31 to vary. This makes it possible to move the point-bonding positions (contact positions) which are equivalent to the top sections of the respective protruding portions 30 to sections equivalent to the respective recess portions 31. As a result, in the respective point-bonding positions, the wafer sheet 3 can be removed from the bottom surface of the IC chip 1. That is, a region of a partial removal between the bottom surface of the IC chip 1 and the wafer sheet 3 is made to expand, so that the wafer sheet 3 can be removed.

Further, even with the reciprocal movement of the removing portion 21, the wafer sheet 3 is sucked and held by the respective suction hole portions 34 around the removing portion 21, which makes it possible to prevent misalignment and the like of the wafer sheet 3 from occurring. Further, since the adhesion region R4 of the adjacent IC chips 1 does not overlap with a top surface-region of the wafer sheet 3 which is equivalent to the movement region R2, other IC chips 1 are prevented from being removed from the wafer sheet 3.

After that, as shown in FIG. 1, the suction nozzle 11 and the IC chip 1 are aligned by the XY robot 12, the suction nozzle 11 is lowered, and the top surface of the IC chip 1 in the state of being removed is sucked and held by the suction nozzle 11. Then, by raising the suction nozzle 11, the IC chip 1 is sucked and extracted from the top surface of the wafer sheet 3.

It is to be understood that in the above-stated description of the removing operation, there has been explained the case where the reciprocal movement of the contact plane 21a of the removing portion 21 changes the point-bonding positions at the top sections of the respective protruding portions 30 for removing the wafer sheet 3 from the bottom surface of the IC chip 1. However, instead of this case, it is also applicable to considerably reduce adhesion (i.e., bonding force) between the bottom surface of the IC chip 1 and the wafer sheet 3 by changing the respective point-bonding positions. Such considerable reduction of the adhesion makes it possible to easily remove the IC chip 1 with force produced by the sucking and extracting operation with the suction nozzle 11 without damaging the IC chip 1.

Moreover, the present embodiment is not limited to the case where the force to suck the wafer sheet 3 with a suction pressure transmitted to the respective suction hole portions 32 formed on the contact plane 21a of the removing portion 21 and the force to suck and hold the wafer sheet 3 with a suction pressure transmitted to the respective suction hole portions 34 formed on the contact plane 22a of the pepper pot 22 are almost equal. Instead of such a case, the case where the respective suction pressures transmitted to each of the suction hole portions 32 and the suction hole portions 34 are differentiated by the valve 38 and the valve 39 for making the respective pressures different from each other may be adopted. In such a case, it is preferable to set the force to suck and hold the wafer sheet 3 by the respective suction hole portions 34 to be larger than the force to suck the wafer sheet 3 by the respective suction hole portions 32 for removal of the wafer sheet 3. With such a setting, it becomes possible to perform removing operation of the wafer sheet 3 while reliably sucking and holding the wafer sheet 3 without being influenced by the reciprocal movement of the removing portion 21.

Moreover, in the removing apparatus 5, there has been described the case where the removing portion 21 is reciprocated by the reciprocational moving apparatus 24 in the direction along the surface of the wafer sheet 3, so that the wafer sheet 3 is removed from the bottom surface of the IC chip 1. However, the moving operation of the removing portion 21 for the removal of the wafer sheet 3 is not limited to such a case. Hereinbelow, description will be given of the structure and operation of a removing portion 71 according to a modified example of the present invention.

Figure 7:
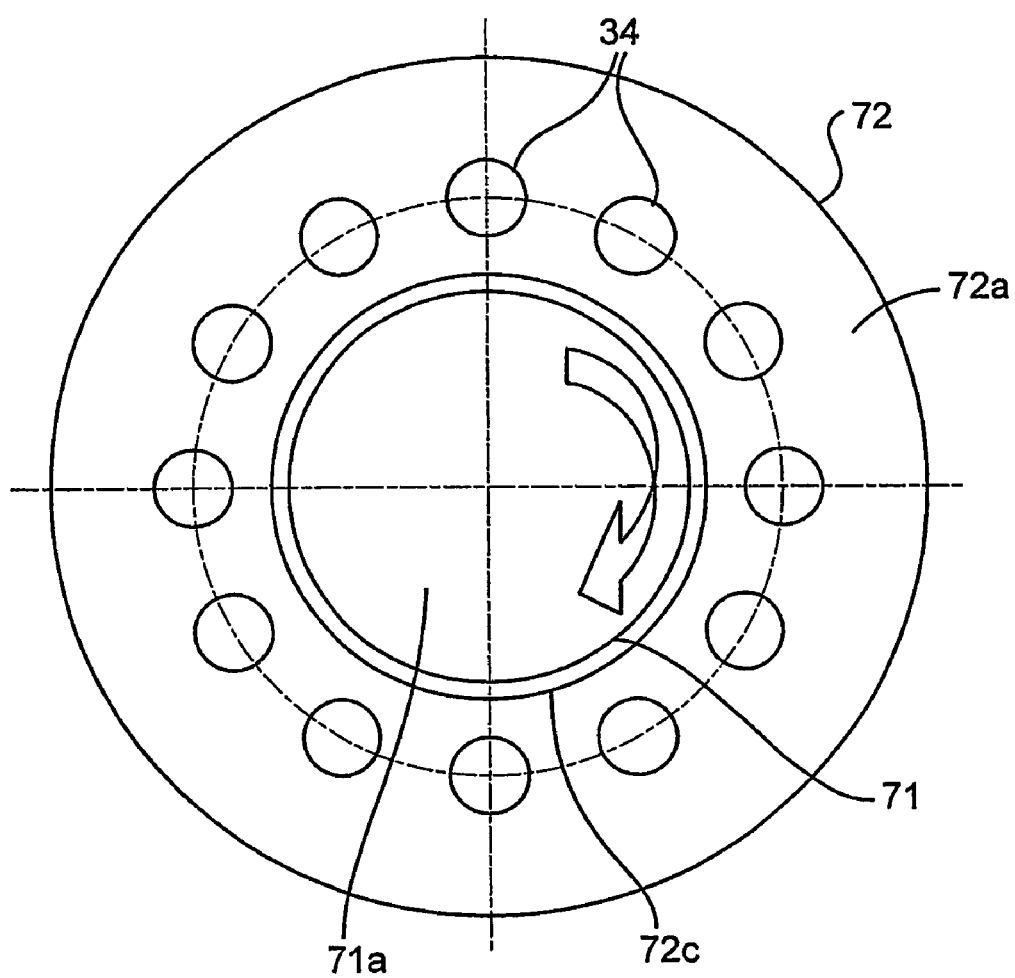
FIG. 7 is a schematic plan view showing an upper part of a removing apparatus in a modified example of the present embodiment.
Figure 8:
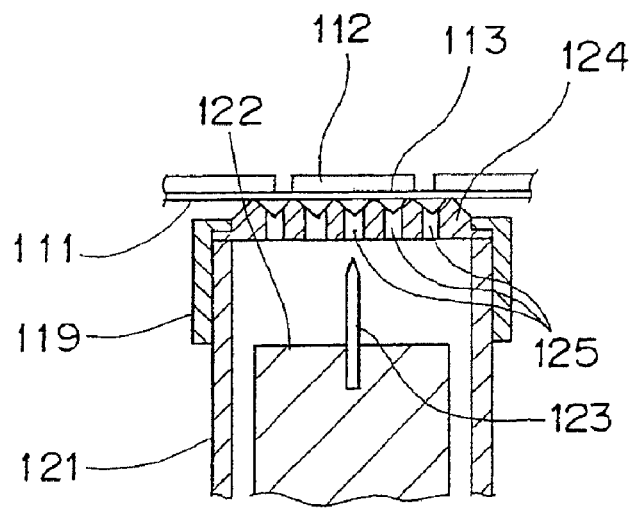
FIG. 8 is a schematic explanatory view showing the state before removal in a prior art removing method.
Figure 9:
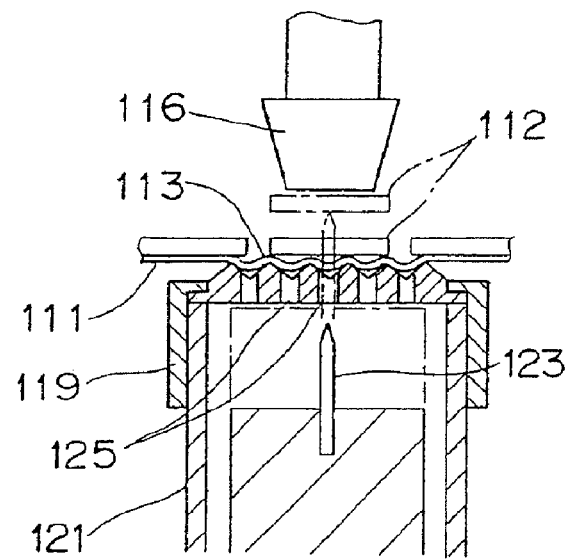
FIG. 9 is a schematic explanatory view showing the removing and push-up operation state in the prior art moving method of FIG. 8.

FIG. 7 shows a schematic plane view of the upper part of a removing apparatus including such a removing portion 71. As shown in FIG. 7, a contact plane 71a of the removing portion 71 is formed into an almost circular shape, and inside a removing portion movable opening 72c which is also formed into an almost circular shape in a center section of a contact plane 72a of a pepper pot 72, the contact plane 71a of the removing portion 71 is disposed. Moreover, the contact plane 71a of the removing portion 71 is capable of rotationally moving, as indicated by the directional arrow in the removing portion 71a, around the center of the almost circular shape by the driving device (not shown).

Thus, as with the case of the reciprocal movement by the rotational movement of the contact plane 71a, the positions of the respective protruding portions 30 on the contact plane 71a can be changed, and the removing operation of the wafer sheet 3 may be conducted by changing respective point-bonding positions between the bottom surface of the IC chip 1 and the wafer sheet 3. Further, adopting the structure involving the rotational movement of the removing portion 71 makes it possible to eliminate the necessity of the structure for converting the rotary motion to the reciprocal motion and to simplify the apparatus structure compared to the structure in which the reciprocal movement is performed.

Further, the case where the removing portion 21 is moved reciprocationally in a specified direction by the reciprocational moving apparatus 24 may be replaced with the case where, for example, vibration is imparted to the removing portion 21 so as to be moved irregularly in the direction along the surface of the wafer sheet 3.

Further, various patterns can be considered as disposition patterns of the respective protruding portions 30 and the recess portions 31 formed on the contact plane 21a of the removing portion 21. For example, it is possible to form the respective recess portions 31 into a linear groove and to alternately dispose the linear-shaped respective protruding portions 30 and the linear-shaped respective recess portions 31. In such a case, it is preferable to perform the reciprocal movement in the direction perpendicular to the linear-shaped protruding portions 30 and recess portions 31. Moreover, it is also possible to form the respective recess portions 31 as a concentric groove and to dispose the respective protruding portions 30 and recess portions 31 concentrically. Further, it is also acceptable to form the respective protruding portions 30 and recess portions 31 to be aligned irregularly.

According to the above embodiment, the following various effects may be achieved.

First, in the removing apparatus 5, there are formed on the contact plane 21a of the removing portion 21 which come into contact with the bottom surface of the IC chip 1 to be removed through the wafer sheet 3a, a plurality of protruding portions 30 which come into contact with the bottom surface through the wafer sheet 3 (or which support the IC chip 1), and a plurality of suction hole portions 32 which are formed in the recess portions 31 formed in between the respective protruding portions 30 and which are capable of sucking the wafer sheet 3. Consequently, a suction pressure is transmitted to the respective suction hole portions 32, so that the wafer sheet 3 can be partially removed from the bottom surface of the IC chip 1 at respective suction positions in such a way that the wafer sheet 3 is close to or brought into contact with the surface of the respective recess portions 31.

Further, there is provided the reciprocational moving apparatus 24 for moving (e.g., reciprocating) the contact plane 21a of the removing portion 21 along the bottom surface of the IC chip 1 so as to vary support positions (contact position) of the IC chip 1 by the respective protruding portions 30 through the wafer sheet 3 and suction positions of the wafer sheet 3 by the respective suction hole portions 32 in such a state. By this movement, the wafer sheet 3 in the partially removed state is further removed to reach a completely removed state or the adhesive bonding force can be considerably reduced.

More specifically, the surface bonding of the wafer sheet 3 to the IC chip 1 by adhesion is changed to the point bonding through suction by the respective suction hole portions 32, and further the contact plane 21a of the removing portion 21 is moved as described above, so that the respective point-bonding positions can be changed, allowing considerable reduction of the adhesive bonding force.

With the IC chip 1 in this state, even if the IC chip 1 is, for example, the thinner semiconductor chip with a thickness of 50 μm or less, sucking and extracting operation by the suction nozzle can be easily performed without employing a push-up pin in a push-up operation. Moreover, since the IC chip 1 is completely removed from the wafer sheet 3 or the adhesive bonding force is considerably reduced, the IC chip 1 will not be damaged even if a sucking and extracting operation by the suction nozzle applies a force to the IC chip 1 to cause it to rise from the surface of the wafer sheet 3. Therefore, the thinner IC chip can be reliably removed from the wafer sheet and be extracted without being damaged.

Further, the removing apparatus 5 further includes the pepper pot 22 having a plurality of suction hole portions 34 for sucking and holding the bottom surface of the wafer sheet 3 in the vicinity of the contact plane 21a of the removing portion 21. Consequently, even if the removing portion 21 is moved for the removal of the IC chip, applying the suction pressure to the respective suction hole portions 34 makes it possible to reliably hold and fix the wafer sheet 3 in the vicinity of the contact plane 21a of the removing portion 21. Therefore, the movement of the contact plane 21a of the removing portion 21 achieves reliable and efficient removal of the wafer sheet 3 from the bottom surface of the IC chip. Further, it becomes possible to prevent an influence of the removing operation on the wafer sheet 3 in the vicinity of the contact plane 21a, including an influence of removing the vicinity section, from occurring.

Further, the contact plane 21a is formed such that only one IC chip 1 to be removed is disposed in a top surface region of the wafer sheet 3 corresponding to a movement region R2 that is the reciprocal movement region of the contact plane 21a of the removing portion 21 by the reciprocating moving apparatus 24, and other adjacent IC chips 1 are not disposed therein. Consequently, the moving operation of the contact plane 2a for the removal of the IC chip makes it possible to reliably remove the wafer sheet 3 only from the one IC chip 1 without removing the wafer sheet 3 from the adjacent IC chips 1.

Further, the top surface-region of the wafer sheet 3 corresponding to the suction region R3 of the wafer sheet 3 by the respective suction hole portions 34 formed on the contact plane 22a of the pepper pot 22 is disposed adjacent to the adhesion region R1 of the IC chip 1 to be removed, which makes it possible to reliably suck and hold the wafer sheet 3 during a moving operation for the removal of the semiconductor chip, and prevent the moving operation from affecting the adjacent IC chips 1 and the like.

Further, the IC chip 1 is removed from the wafer sheet 3, not in the state in which the IC chip 1 is sucked and held by the suction nozzle, but in the state in which the wafer sheet 3 is sucked and held from its bottom surface, which allows implementation of the removing operation independently of the operation of a mounting head side. More specifically, removal of the IC chip 1 can be conducted regardless of whether or not the mounting head is in a standby state for sucking and extracting the IC chip 1. Consequently, the removing operation of the IC chip 1 can be conducted during, for example, a mounting operation by the mounting head, thereby allowing efficient feeding of the IC chips.

By properly combining the arbitrary embodiments of the aforementioned various embodiments, the effects possessed by the embodiments can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2003-315269 filed on Sep. 8, 2003 including specification, drawing and claims are incorporated herein by reference in its entirety.

The invention claimed is:

1. A method for removing semiconductor chip in which one out of a plurality of semiconductor chips formed from a diced semiconductor wafer is removed from a pressure-sensitive adhesive sheet, which holds the semiconductor chips by adhering thereto, so that the semiconductor chip is extracted from the adhesive sheet, the method comprising:
   bringing a plurality of protruding portions on a first contact surface of a removing member into contact with a bottom surface of the semiconductor chip through the adhesive sheet at a region on a bottom surface side of the adhesive sheet while sucking and holding a vicinity of the bottom surface-side region of the adhesive sheet corresponding to an adhesion region of the semiconductor chip by a second contact surface of a holding portion located around the first contact surface;
   sucking the adhesive sheet in between the respective protruding portions so as to partially remove the adhesive sheet in the adhesion region from the semiconductor chip at suction positions; and
   moving respective contact positions with the protruding portions to the suction positions on the bottom surface-side region of the adhesive sheet by moving the removing member along the bottom surface of the semiconductor chip relative to the holding portion, in a condition in which the first contact surface is located at an almost same height of the second contact surface, so that a region of the partial removal in the adhesion region is made to expand.

2. The method for removing semiconductor chip as defined in claim 1, wherein a force for sucking and holding the vicinity of the bottom surface-region of the adhesive sheet corresponding to the adhesion region is set to be larger than a force for sucking the adhesive sheet in between the respective protruding portions.

3. The method for removing semiconductor chip as defined in claim 2, wherein the force for sucking and holding the vicinity of the bottom surface-region of the adhesive sheet corresponding to the adhesion region is controlled by a first valve, and the force for sucking the adhesive sheet in between the respective protruding portions is controlled by a second valve.

4. The method for removing semiconductor chip as defined in claim 1, wherein the movement of the removing member is a reciprocal movement of the removing member in a specified direction along the bottom surface of the semiconductor chip.

5. The method for removing semiconductor chip as defined in claim 4, wherein an amplitude of the reciprocal movement of the removing member is larger than a formation interval of the respective protruding portions.

6. The method for removing semiconductor chip as defined in claim 1, wherein the movement of the removing member is a rotating movement of the removing member around a direction almost perpendicular to the bottom surface of the semiconductor chip.

7. The method for removing semiconductor chip as defined in claim 1, wherein the movement of the removing member is a reciprocal movement of the removing member in a specified direction with a specified amplitude along the bottom surface of the semiconductor chip.

* * * * *